US008865508B2

(12) United States Patent
Park et al.

(10) Patent No.: US 8,865,508 B2
(45) Date of Patent: Oct. 21, 2014

(54) METHOD OF FABRICATING A SEMICONDUCTOR DEVICE

(71) Applicant: Samsung Electronics Co., Ltd., Suwon-si (KR)

(72) Inventors: Dae-Keun Park, Hwaseong-si (KR); Dong-Jo Kang, Suwon-si (KR); Hyoung-Jun Kim, Hwaseong-si (KR); Jin-Sung Chung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/861,591

(22) Filed: Apr. 12, 2013

(65) Prior Publication Data
US 2014/0011316 A1 Jan. 9, 2014

(30) Foreign Application Priority Data

Jul. 3, 2012 (KR) ........................ 10-2012-0072472

(51) Int. Cl.
*H01L 27/146* (2006.01)
*H01L 31/18* (2006.01)

(52) U.S. Cl.
CPC ............ *H01L 31/18* (2013.01); *H01L 27/1464* (2013.01); *H01L 27/1463* (2013.01); *H01L 27/14627* (2013.01); *H01L 27/14621* (2013.01); *H01L 27/14683* (2013.01); *H01L 27/14636* (2013.01)
USPC ........ 438/70; 438/98; 257/432; 257/E31.127; 257/E31.11

(58) Field of Classification Search
CPC .............. H01L 31/18; H01L 27/10894; H01L 21/76838; H01L 27/14609; H01L 27/14645; H01L 27/1464; H01L 27/14636; H01L 27/1463; H01L 31/103; H01L 27/14683; G03F 7/70633; G03F 9/7088; G03F 9/7084; G03F 9/7076
See application file for complete search history.

(56) References Cited

U.S. PATENT DOCUMENTS

| 6,004,866 | A | 12/1999 | Nakano et al. | |
|---|---|---|---|---|
| 7,101,726 | B2 * | 9/2006 | Yamamoto et al. | 438/69 |
| 2006/0154491 | A1 * | 7/2006 | Xie et al. | 438/760 |
| 2006/0205202 | A1 * | 9/2006 | Chung | 438/624 |
| 2007/0231483 | A1 * | 10/2007 | Nanba et al. | 427/240 |
| 2010/0006969 | A1 * | 1/2010 | Park et al. | 257/446 |
| 2010/0072568 | A1 * | 3/2010 | Park | 257/432 |
| 2010/0096718 | A1 * | 4/2010 | Hynecek et al. | 257/460 |
| 2011/0003462 | A1 | 1/2011 | Akiyama et al. | |

(Continued)

FOREIGN PATENT DOCUMENTS

| JP | 7-74329 | 3/1995 |
|---|---|---|
| JP | 3030545 | 2/2000 |

(Continued)

*Primary Examiner* — Jarrett Stark
*Assistant Examiner* — Bitew Dinke
(74) *Attorney, Agent, or Firm* — Onello & Mello, LLP

(57) ABSTRACT

Provided is a semiconductor device having a backside illuminated image sensor and a method of forming same. The method includes providing a first substrate and a second substrate, forming metal interconnections on a first surface of the first substrate, forming a filling insulating layer filling spaces between sides of the metal interconnections and covering upper surfaces of the metal interconnections, forming a buffer insulating layer softer than the filling insulating layer on the filling insulating layer, forming a capping insulating layer denser than the buffer insulating layer on the buffer insulating layer, and bonding a surface of the capping insulating layer to a surface of the second substrate.

20 Claims, 25 Drawing Sheets

(56) References Cited

U.S. PATENT DOCUMENTS

| | | |
|---|---|---|
| 2011/0062540 A1* | 3/2011 | Saito et al. .................... 257/432 |
| 2011/0084350 A1* | 4/2011 | Murakoshi et al. ............ 257/432 |
| 2011/0111594 A1 | 5/2011 | Kikuchi |
| 2011/0129986 A1* | 6/2011 | Libralesso et al. ............ 438/455 |
| 2011/0186951 A1* | 8/2011 | Pyo ................................ 257/432 |
| 2011/0212567 A1* | 9/2011 | Tsai et al. ........................ 438/70 |
| 2011/0291219 A1* | 12/2011 | Kwon ............................ 257/447 |
| 2012/0034773 A1* | 2/2012 | Ott et al. ........................ 438/592 |
| 2012/0147208 A1* | 6/2012 | Otsuka et al. .............. 348/222.1 |
| 2012/0199882 A1* | 8/2012 | Shin ............................... 257/222 |
| 2012/0248580 A1* | 10/2012 | Matsugai et al. .............. 257/621 |
| 2013/0009269 A1* | 1/2013 | Testa et al. .................... 257/448 |
| 2013/0062737 A1* | 3/2013 | Hongo et al. .................. 257/622 |
| 2013/0249033 A1* | 9/2013 | KIM et al. ..................... 257/432 |
| 2014/0151835 A1* | 6/2014 | HUANG et al. .............. 257/432 |

FOREIGN PATENT DOCUMENTS

| | | |
|---|---|---|
| JP | 2001-94079 | 4/2001 |
| KR | 1998-060508 | 10/1998 |
| KR | 2001-0016659 | 3/2001 |
| KR | 10-2011-0010326 | 2/2011 |

* cited by examiner

METHOD OF FABRICATING A SEMICONDUCTOR DEVICE

CROSS-REFERENCE TO RELATED APPLICATION

This application claims priority under 35 U.S.C. §119 to Korean Patent Application No. 10-2012-0072472 filed on Jul. 3, 2012, the disclosure of which is hereby incorporated by reference in its entirety.

FIELD

The inventive concept relates to a semiconductor device having a backside illuminated image sensor, a method of fabricating the same, and an electronic system having the same.

BACKGROUND

In order to improve light receiving efficiency of a CMOS image sensor, a backside illuminated image sensor (BIS) in which light is received at the backside, has been suggested.

To implement a backside illuminated image sensor, a process of bonding of a device wafer and a supporting wafer is needed. In the field of a wafer-to-wafer bonding technology, when oxide and silicon are bonded together, voids are generated in the surface of the oxide. The reason this occurs is that the oxide has a rough and hydrophobic surface. Consequently, the oxide has poor stability in bonding process, which results in the voids between wafers.

Voids between the bonded silicon and oxide wafers are undesirable because the voids create transmission degradation and inefficiencies.

SUMMARY

In accordance with aspects of the inventive concept, provided is a semiconductor device having a backside illuminated image sensor.

Various embodiments of the inventive concept provide a method of forming a semiconductor device having a backside illuminated image sensor.

Still other embodiments of the inventive concept provide an electronic system including a semiconductor device having a backside illuminated image sensor.

In accordance with an aspect of the inventive concept, a method of forming a semiconductor device is provided. The method of forming a semiconductor device includes providing a first substrate and a second substrate, forming metal interconnections on a first surface of the first substrate, forming a filling insulating layer filling spaces between sides of the metal interconnections and covering upper surfaces of the metal interconnections, forming a buffer insulating layer softer than the filling insulating layer on the filling insulating layer, forming a capping insulating layer denser than the buffer insulating layer on the buffer insulating layer, and bonding a surface of the capping insulating layer to a surface of the second substrate.

In various embodiments, the filling insulating layer may comprise HDP oxide.

In various embodiments, the buffer insulating layer may comprise PE-TEOS oxide.

In various embodiments, the buffer insulating layer may comprise a lower buffer insulating layer and an upper buffer insulating layer, and the lower and upper buffer insulating layers may include the same material.

In various embodiments, the method may further comprise planarizing the upper buffer insulating layer before forming the capping insulating layer.

In various embodiments, the method may further comprise wet-etching a surface of the upper buffer insulating layer when planarizing the upper buffer insulating layer.

In various embodiments, the method may further comprise annealing the upper buffer insulating layer after planarizing the upper buffer insulating layer.

In various embodiments, the capping insulating layer may comprise HDP oxide.

In various embodiments, the forming of the capping insulating layer may comprise loading the first substrate on a chuck in a vacuum chamber; supplying silane gas and oxygen gas at a volume ratio of greater than 2 to 1 into the vacuum chamber; applying a source power of greater than 3 KW into the vacuum chamber; and heating the chuck at a temperature of higher than 250 degrees Celsius.

In various embodiments, the method may further comprise recessing the surface of the capping insulating layer using a planarization process.

In various embodiments, the method may further comprise wet-etching the surface of the capping insulating layer using hydrofluoric acid when planarizing the capping insulating layer.

In various embodiments, the method may further comprise applying a nitrogen plasma treatment to the surface of the second substrate before bonding the first substrate to the second substrate.

In various embodiments, the method may further comprise forming field regions in the first substrate and a photodiode between the field regions before forming the metal wirings, recessing a second surface of the first substrate after bonding the capping insulating layer to the second substrate; forming a second surface insulating layer on the recessed second surface, forming color filters on the second surface insulating layer, and forming microlenses on the color filters.

In various embodiments, the bonding the surface of the capping insulating layer to the surface of the second substrate may comprise forming a HDP oxide layer on the surface of the second substrate, and bonding the surface of the capping insulating layer to a surface of the HDP oxide layer.

In accordance with another aspect of the inventive concept, a method of forming a semiconductor device is provided. The method of forming a semiconductor device includes providing a device substrate and a supporting substrate, forming photodiodes in the device substrate, forming interlayer insulating layers and metal interconnections on a first surface of the device substrate, forming a lower HDP oxide layer covering the metal interconnections, forming a PE-TEOS oxide layer on the lower HDP oxide layer, planarizing a surface of the PE-TEOS oxide layer, forming an upper HDP oxide layer on the surface of the planarized PE-TEOS oxide layer, planarizing a surface of the upper HDP oxide layer, and bonding a surface of the supporting substrate to the upper HDP oxide layer.

In accordance with another aspect of the inventive concept, provide is a semiconductor device. The semiconductor device comprises a first substrate, a set of metal interconnections formed on a first surface of the first substrate, a filling insulating layer filling spaces between sides of the metal interconnections and covering upper surfaces of the metal interconnections, a buffer insulating layer formed on the filling insulating layer, a capping insulating layer formed on the buffer insulating layer, and a second substrate bonded to a surface of the capping insulating layer.

In various embodiments, the device may further comprise field regions in the first substrate, a photodiode between the field regions, a recessed second surface of the first substrate, a second surface insulating layer formed on the recessed second surface, a plurality of color filters disposed on the second surface insulating layer, and a plurality of microlenses formed on the color filters.

In various embodiments, the buffer insulating layer may comprise a lower buffer insulating layer and an upper buffer insulating layer, and the lower and upper buffer insulating layers may include the same material.

In various embodiments, the buffer insulating layer may softer than the filling insulating layer and/or the capping insulating layer may be denser than the buffer insulating layer.

In various embodiments, the semiconductor device forms part of a mobile apparatus.

In various embodiments, a semiconductor device may be provided as shown in the drawings and as described with respect thereto.

In various embodiments, a method of making a semiconductor device may be provided as shown in the drawings and as described with respect thereto.

In various embodiments, an apparatus including a semiconductor device may be provided as shown in the drawings and as described with respect thereto. As examples, such apparatus may include or be a mobile apparatus (e.g., cellphone, e-reader, tablet, etc.), laptop or desktop computer, workstation, server, network appliance, home appliance, entertainment device, and so on.

BRIEF DESCRIPTION OF THE DRAWINGS

The foregoing and other features and advantages of the inventive concept will be apparent from a description of illustrative embodiments that providing teachings in accordance therewith, as illustrated in the accompanying drawings. In such drawings like reference characters generally refer to the same parts throughout the different views. The drawings are not necessarily to scale, emphasis instead being placed upon illustrating the principles of the inventive concept. In the drawings.

DETAILED DESCRIPTION OF THE EMBODIMENTS

Figure 1A:
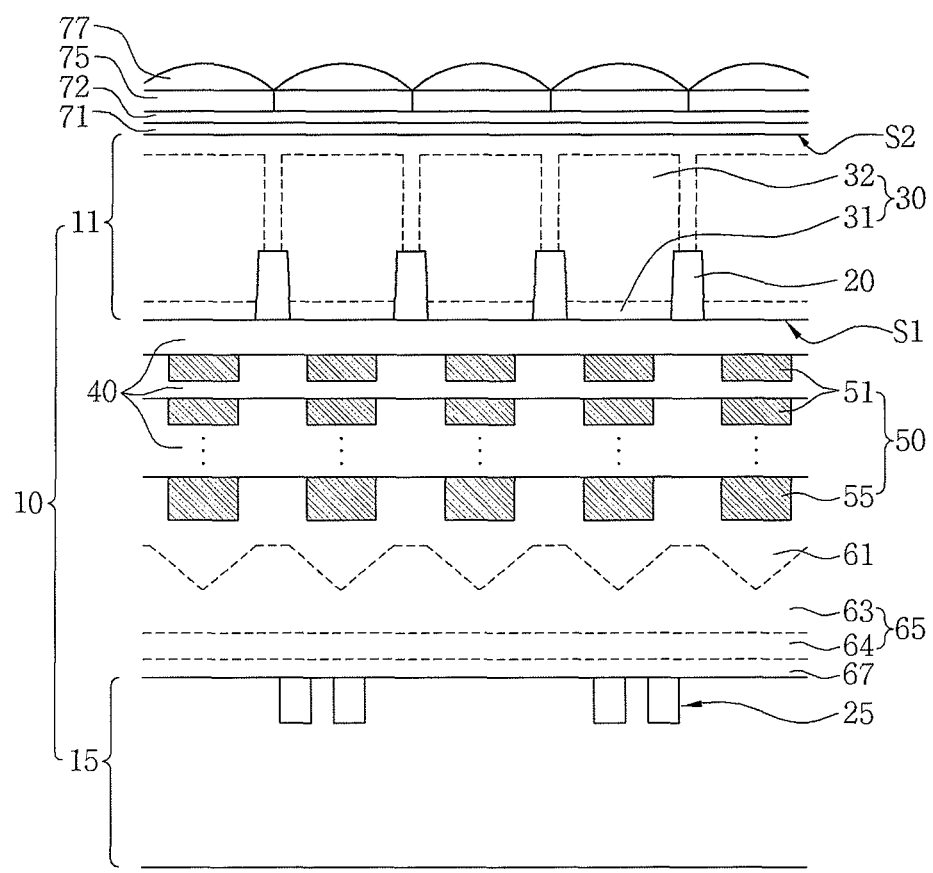
FIGS. 1A to 1C are cross-sectional views schematically illustrating embodiments of features of semiconductor devices having a backside illuminated image sensor, in accordance with aspects of the inventive concept.

Various aspects of the inventive concept will now be described more fully with reference to the accompanying drawings in which some illustrative embodiments are shown. The inventive concept may, however, be embodied in different forms and should not be construed as limited to the embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the team "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concept.

Spatially relative terms, "front side" and "back side", may be used herein for ease of description to describe one element or feature's relationship to another element(s) or feature(s) as illustrated in the figures. It will be understood that the spatially relative terms, "front side" and "back side", are intended to encompass different orientations of the device in use or operation in addition to the orientation depicted in the figures. For example, the term "front side" may be interpreted as the term "back side", and the term "back side" may be interpreted as the term "front side". Thus, the term "front side" may be expressed as "first", and the term "back side" may be expressed as "second". Alternatively, the term "back side" may be expressed as "first," and the term "front side" may be expressed as "second". However, in one embodiment, the terms "front side" and "back side" should be interpreted as having different meanings.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
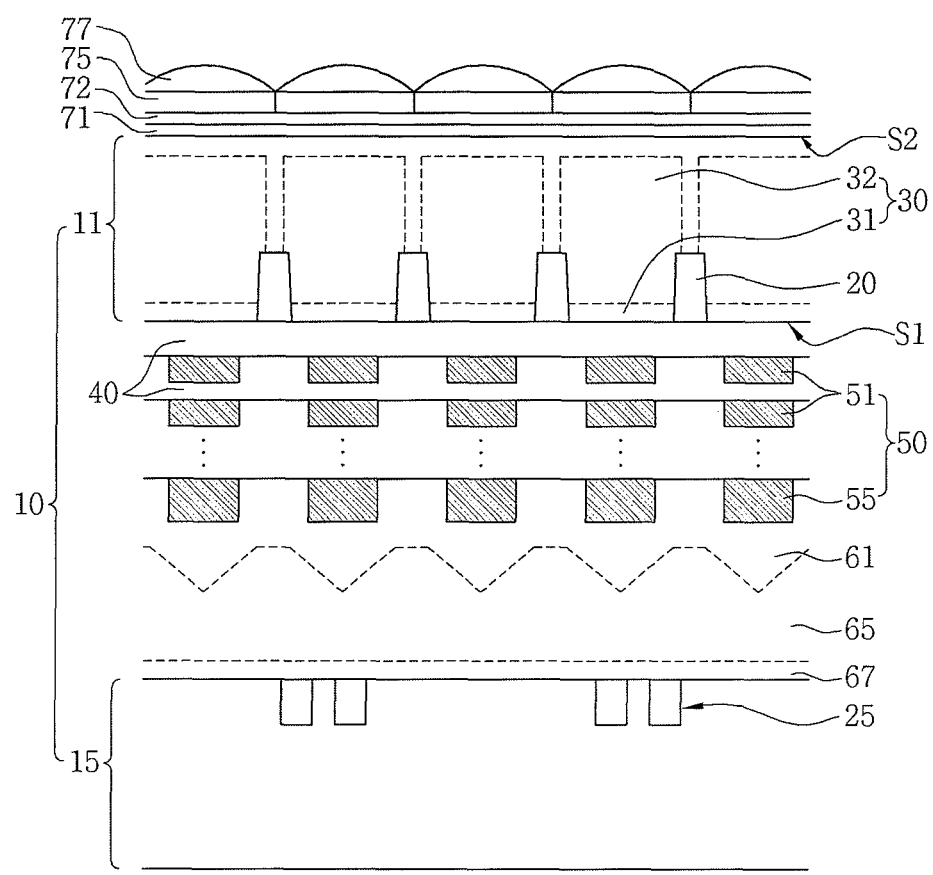
Figure 1C:
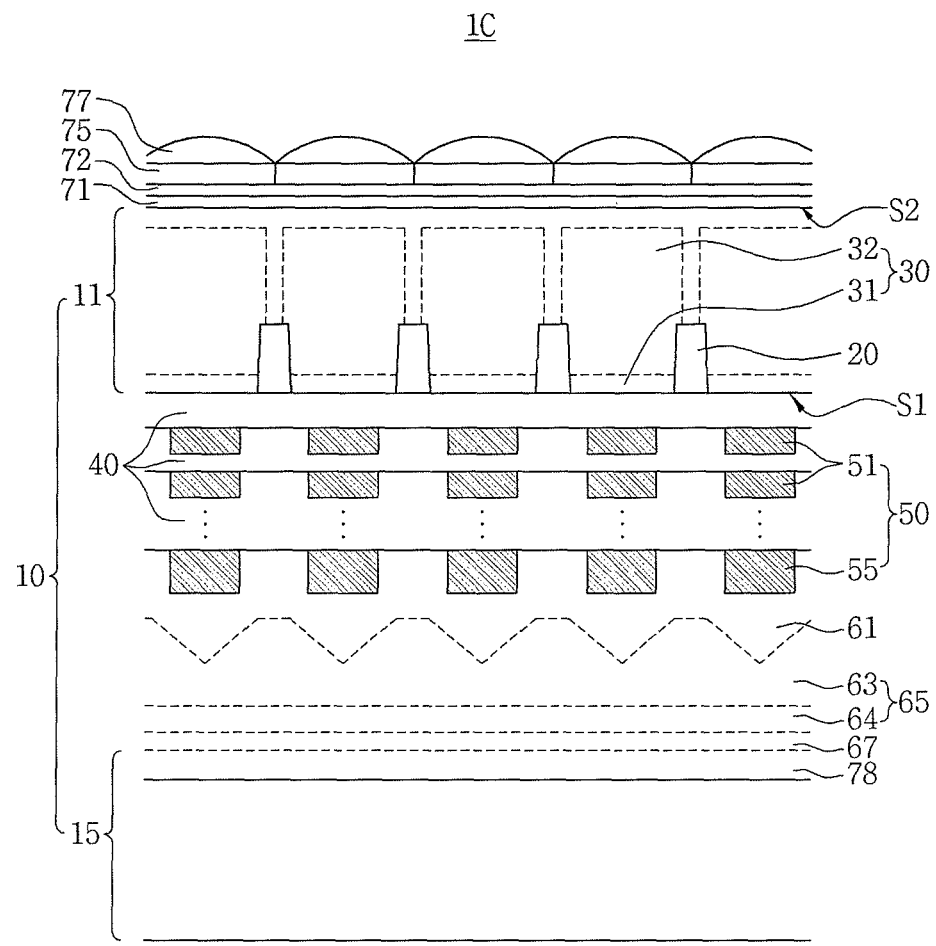

FIGS. 1A to 1C are cross-sectional views schematically illustrating embodiments of semiconductor devices 1A, 1B, and 1C, in accordance with aspects of the inventive concept.

Referring to FIG. 1A, an embodiment of a semiconductor device 1A in accordance with an aspect of the inventive concept may include a bonded substrate structure 10 in which a device substrate 11 and a supporting substrate 15 are bonded together. The device substrate 11 and the supporting substrate 15 may include a silicon bulk wafer, for example.

The semiconductor device 1A may include field regions 20 and photodiodes 30 formed in the device substrate 11. The field regions 20 may include a shallow trench isolation (STI). The field regions 20 may be located close to or abutting against a first surface S1 of the device substrate 11. The photodiodes 30 may include p-type regions 31 located close to or abutting against the first surface S1 of the device substrate 11, and n-type regions 32 located inside the device substrate 11.

The semiconductor device 1A may include multi-layered interlayer insulating layers 40, multi-layered metal interconnection layers 50, a filling insulating layer 61, a lower buffer insulating layer 63, an upper buffer insulating layer 64, and a capping insulating layer 67, which are disposed under the first surface S1 of the device substrate 11. In the illustrative embodiment, the multi-layered interlayer insulating layers 40, multi-layered metal interconnection layers 50, filling insulating layer 61, a lower buffer insulating layer 63, an upper buffer insulating layer 64, and a capping insulating layer 67 are sequentially stacked on the supporting substrate 15.

The multi-layered interlayer insulating layers 40 may include silicon oxide, as an example. The multi-layered metal interconnection layers 50 may include tungsten (W), aluminum (Al), copper (Cu), or other various metals and electrically conductive materials. The multi-layered metal interconnection layers 50 may include internal metal interconnections 51 and uppermost metal interconnections 55, which can take the firm of metal wires. The uppermost metal interconnections 55 may be disposed on the uppermost part of the multi-layered interlayer insulating layers 40. For example, in some embodiments, the internal metal interconnections 51 may be surrounded by interlayer insulating layers 40, while side and upper surfaces of the uppermost metal interconnections 55 may not be surrounded by the interlayer insulating layers 40. Although, the uppermost metal interconnections 55 may contact one or more surfaces of at least one of the interlayer insulating layers 40.

As shown in the illustrative embodiment, the side and upper surfaces of the uppermost metal interconnections 55 may be surrounded by the filling insulating layer 61. The filling insulating layer 61 may fill the spaces between the uppermost metal interconnections 55, and may fully cover portions of the uppermost metal interconnections 55 not covered by the interlayer insulating layers 40. The filling insulating layer 61 may have a surface profile according to morphology of the uppermost metal interconnections 55. For example, surface morphology may be relatively low (i.e., nearer the interlayer insulating layers 40) at a part in contact with the interlayer insulating layers 40, and relatively high (i.e., farther from the interlayer insulating layers 40) at a part formed on the uppermost metal interconnections 55. A surface of the filling insulating layer 61 may have a positive or negative slope. The filling insulating layer 61 may have an apex extending toward the supporting substrate 15 in the area formed in the uppermost metal interconnections 55. The filling insulating layer 61 may include a high density plasma (HDP) oxide material. For example, the filling insulating layer 61 may include silicon oxide formed by a HDP deposition process, in some embodiments.

The lower buffer insulating layer 63 may be formed from a material that is softer than the filling insulating layer 61. The lower buffer insulating layer 63 may have a smoother surface than the filling insulating layer 61. The lower buffer insulating layer 63 may be formed to be thicker than the filling insulating layer 61. The lower buffer insulating layer 63 may include plasma enhanced tetra ethyl ortho silicate (PE-TEOS) oxide. For example, in some embodiments, a lower buffer insulating layer 63 may be formed by a deposition process using TEOS-sourced plasma.

The upper buffer insulating layer 64 may have an even surface that is substantially horizontal. For example, the upper buffer insulating layer 64 may have an overall planarized surface by a planarization process such as CMP. The upper buffer insulating layer 64 may have a thickness that is smaller (or thinner) than the lower buffer insulating layer 63. The upper buffer insulating layer 64 may also include PE-TEOS oxide.

The capping insulating layer 67 may have a smooth surface. For example, the capping insulating layer 67 may also have an overall planarized surface by a planarization process, such as CMP. The capping insulating layer 67 may include HDP oxide, as an example. The HDP oxide may be formed by a HDP deposition process using silane ($SiH_4$) gas and oxygen ($O_2$) gas as source gases, as an example. The capping insulating layer 67 may, therefore, be denser than the buffer insulating layer 65, 63, 64.

The semiconductor device 1A may include a lower second surface insulating layer 71, an upper second surface insulating layer 72, color filters 75, and microlenses 77, which are formed on the second surface S2 of the device substrate 11.

The lower second surface insulating layer 71 may include silicon nitride or silicon oxide, in some embodiments. In other embodiments, the lower second surface insulating layer 71 may include silicon oxide directly formed on the second surface S2 of the device substrate 11, and silicon nitride formed on the silicon oxide. The lower second surface insulating layer 71 may be configured to block light reflected from the inside of the photodiodes 30 or the device substrate 11 in order to prevent the light from leaking to the outside or external to the device. In addition, the lower second surface insulating layer 71 may be configured such that light reflected from upper and lower surfaces interfere with each other and cancel each other out. This may be accomplished by forming the lower second surface insulating layer 71 to have a thickness wherein reflected from upper and lower surfaces interfere with each other and cancel each other out.

The upper second surface insulating layer 72 may include silicon oxide. In another embodiment, the upper second surface insulating layer 72 may include a multi-layered insulating layer having silicon oxide. The lower second surface insulating layer 71 and the upper second surface insulating layer 72 may be referred to as a lower backside insulating layer and an upper backside insulating layer, respectively.

The color filters 75 may be configured to selectively transmit a specific color light. For example, the color filters 75 may include a red-green-blue (RGB) combination or a cyan-magenta-yellow (CMY) combination. The microlenses 77 may include a high molecular weight organic material, in various embodiments.

In the embodiment of FIG. 1A, the semiconductor device 1A may include the supporting substrate 15 in direct contact with the capping insulating layer 67. The supporting substrate 15 may also include alignment keys 25. The alignment keys 25 may have a shape of a recessed groove, trench, furrow, or hole with respect to a surface of the supporting substrate 15, as examples.

Referring to FIG. 1B, an embodiment of a semiconductor device 1B in accordance with aspects of the inventive concept may include a bonded substrate structure 10 in which the device substrate 11 and the supporting substrate 15 are bonded together. The semiconductor device 1B may include field regions 20 and photodiodes 30 formed inside the device substrate 11. The semiconductor device 1B may include multi-layered interlayer insulating layers 40, multi-layered metal interconnection layers 50 with uppermost metal interconnections 55, a filling insulating layer 61, a single-layered buffer insulating layer 65, and a capping insulating layer 67, which are formed under the first surface S1 of the device substrate 11. The single-layered buffer insulating layer 65 may have a more even or smooth surface than the filling insulating layer 61. The buffer insulating layer 65 may be formed to have a sufficiently greater thickness than the filling insulating layer 61. The buffer insulating layer 65 may include PE-TEOS oxide, as an example. For example, the buffer insulating layer 65 may be formed by a plasma deposition process using TEOS as a source. The buffer insulating layer 65 may have a horizontally even or smooth surface. For example, the buffer insulating layer 65 may have an overall planarized surface formed by a planarization process, such as CMP. The semiconductor device 1B may include a lower insulating layer 71, an upper insulating layer 72, color filters 75, and microlenses 77 which are formed on the second surface S2 of the device substrate 11, which may be sequentially formed on the second surface S2 of the device substrate 11. The supporting substrate 15 may be in contact with and bonded to the capping insulating layer 67.

Aspects of the filling insulating layer 61 of FIG. 1B may be substantially as discussed with respect to the embodiment of FIG. 1A.

Referring to FIG. 1C, an embodiment of a semiconductor device 1C in accordance with aspects of the inventive concept may further include a support insulating layer 78 formed between the supporting substrate 15 and the capping insulating layer 67. The support insulating layer 78 may include or be formed from HDP oxide, as an example.

The embodiments of semiconductor devices 1A, 1B, and 1C illustrated in FIGS. 1A to 1C, respectively, in accordance with aspects of the inventive concept may include HDP oxide in direct contact with the supporting substrate 15. The HDP oxide may have a more even or smooth surface than other oxides, such as PE-TEOS oxide, silicate, silazane, etc. Accordingly, the device substrate 11 and the supporting substrate 15 may have fewer voids in an interface and physically stronger bonding therebetween is achieved. The HDP oxide may have a hydrophilic surface compared to the other oxides mentioned above. Therefore, the HDP oxide may be relatively easily bonded with a surface of silicon, as an example.

Figure 2A:
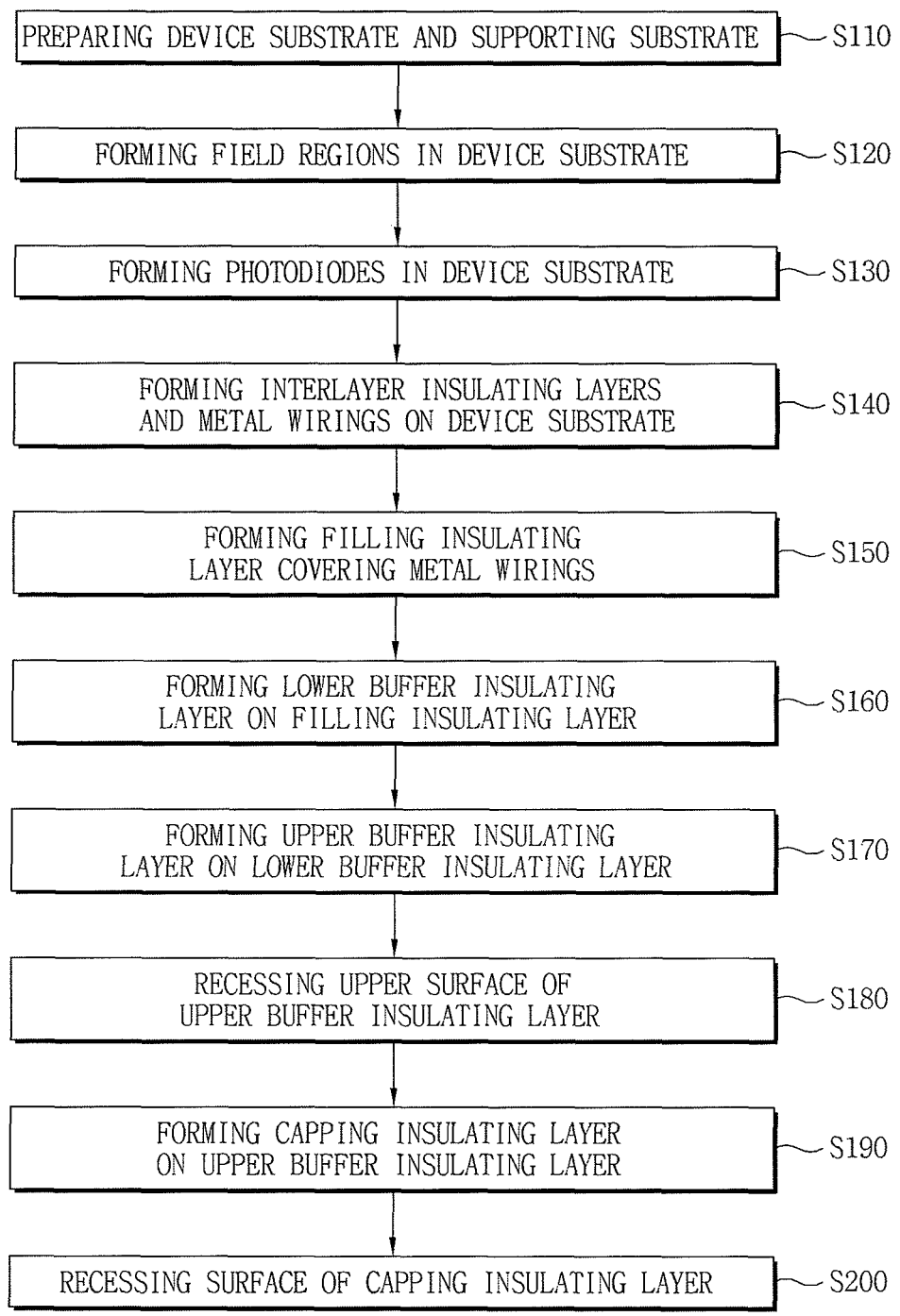
FIGS. 2A and 2B are flowcharts describing embodiments of methods of forming semiconductor devices having a backside illuminated image sensor, in accordance with aspects of the inventive concept.
Figure 2B:
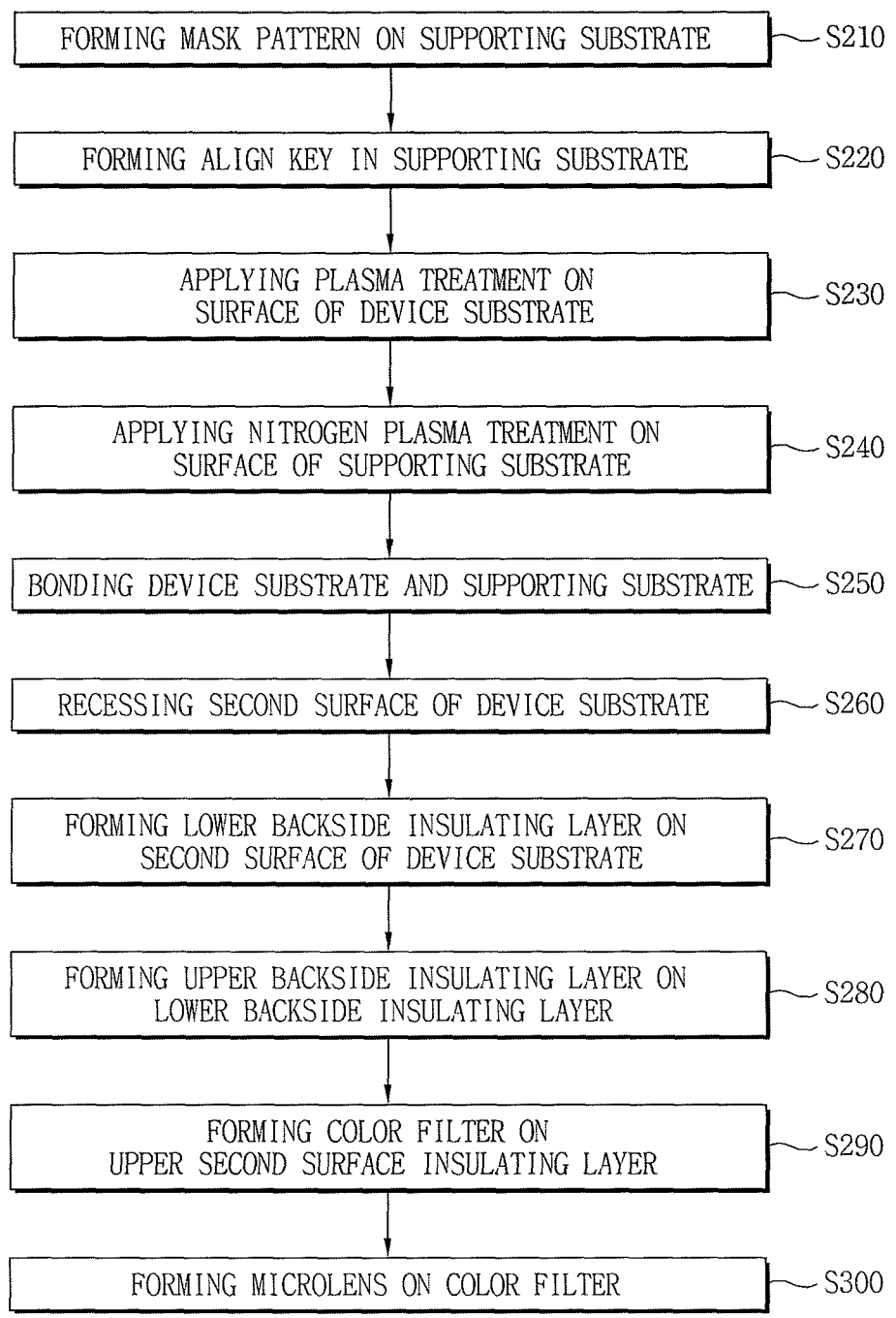
Figure 3A:
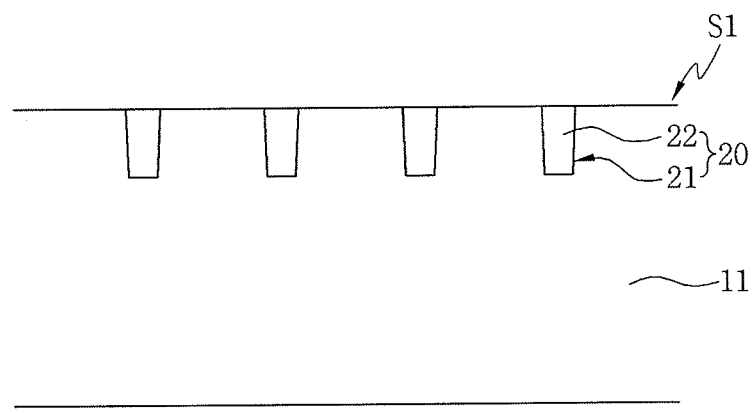
FIGS. 3A to 3O are cross-sectional views describing an embodiment of a method of forming semiconductor devices having a backside illuminated image sensor, in accordance with aspects of the inventive concept.

FIGS. 2A and 2B are flowcharts describing embodiments of methods of forming semiconductor devices, such as semiconductor devices 1A, 1B, and 1C, in accordance with aspects of the inventive concept, and FIGS. 3A to 3O are cross-sectional views describing a method of forming such semiconductor devices, also in accordance with aspects of the inventive concept.

Referring to the embodiments of FIGS. 2A and 3A, the method may include preparing a device substrate 11 and a supporting substrate 15 (not shown) (S110), and forming field regions 20 in the device substrate 11 (S120). The device substrate 11 may include a silicon wafer. The field regions 20 may be formed relatively close to the first surface S1 of the device substrate 11.

The forming the field regions 20 may include forming field trenches 21 in the device substrate 11, and filling the field trenches 21 with a field insulating material 22 having silicon oxide. For example, the field regions 20 may be formed by a shallow trench isolation (STI) process.

Figure 3B:
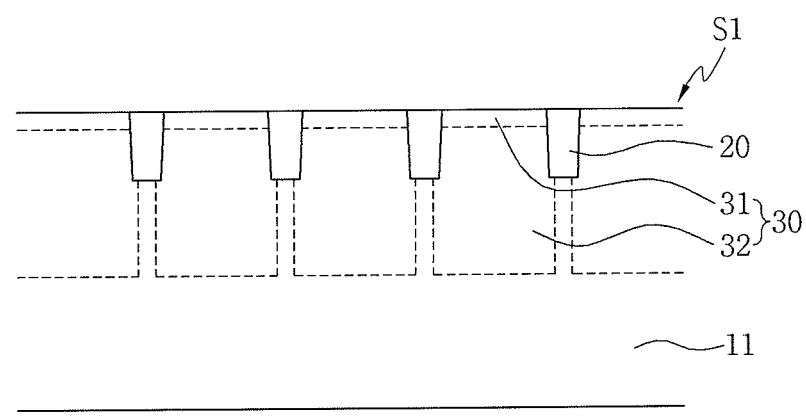

Referring to FIGS. 2A and 3B, the method may include forming photodiodes 30 in the device substrate 11 (S130). The photodiodes 30 may include p-type regions 31 abutting against a surface of the device substrate 11, and n-type regions 32 formed in the device substrate 11. The forming the photodiodes 30 may include injecting n-type impurities, such as phosphorous (P) or arsenic (As), and p-type impurities such as boron (B) into the device substrate 11 by an implantation process, and diffusing the injected impurities by applying heat or ultra violet (UV) light.

Figure 3C:
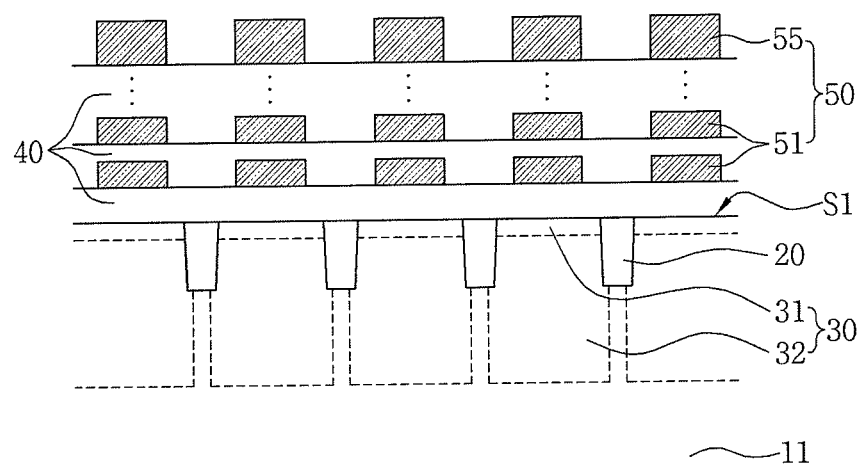

Referring to FIGS. 2A and 3C, the method may include forming interlayer insulating layers 40 and metal interconnection layers 50 on the device substrate 11 (S140). The metal interconnection layers 50 can serve as metal wirings. The interlayer insulating layers 40 may include or be formed of silicon oxide. For example, the interlayer insulating layers 40 may be formed by a HDP process, a plasma enhanced chemical vapor deposition (PE-CVD) process, or a plasma process using TEOS as a source, a middle temperature oxide (MTO) deposition process, or a silicate (e.g., undoped silica glass (USG)) formation process, as examples. The metal interconnection layers 50 may include internal metal interconnections 51 and uppermost metal interconnections 55. The uppermost metal interconnections 55 may have exposed upper and side surfaces. The metal interconnection layers 50 may include or be formed of aluminum, tungsten, copper, other various metals, or a metal compound, as examples.

Figure 3D:
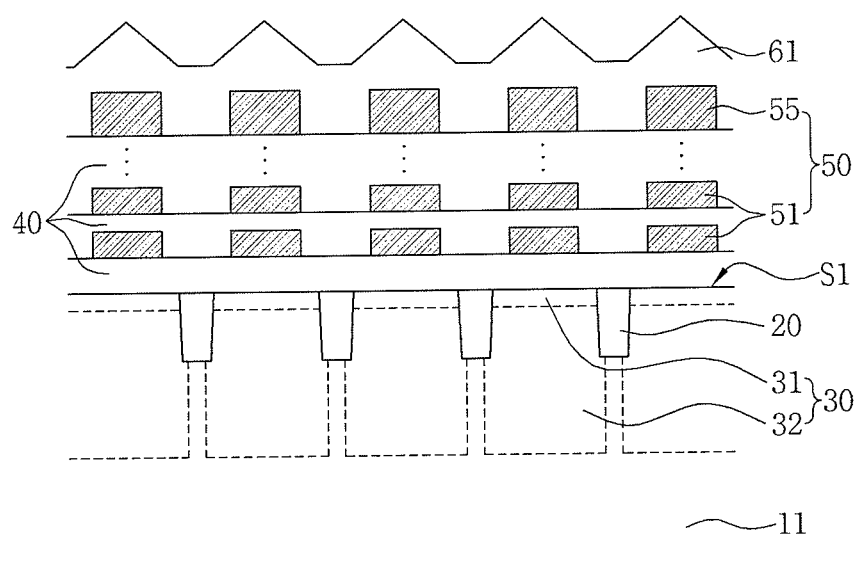

Referring to FIGS. 2A and 3D, the method may include forming a filling insulating layer 61 covering the metal interconnection layers 50 (S150). The filling insulating layer 61 may fill spaces between the uppermost metal interconnections 55 and cover upper surfaces of the uppermost metal interconnections 55. For example, the filling insulating layer 61 may be deposited at a thickness of approximately 1.5 times a vertical thickness of the uppermost metal interconnections 55. The filling insulating layer 61 may include a denser insulating material than the interlayer insulting layers 40. For example, the filling insulating layer 61 may be formed by a HDP deposition process, an atomic layered deposition (ALD) process, or a PE-CVD process. In this embodiment, for example, it is assumed and described that the filling insulating layer 61 includes an insulating material formed by the HDP deposition process, for example, HDP oxide. The HDP oxide may be formed by the HDP process using silane ($SiH_4$) gas and oxygen ($O_2$) gas as source gases, as examples. Accordingly, the filling insulating layer 61 may include a silicon oxide formed of silane gas and $O_2$ gas. Since the HDP oxide includes a relatively less volatile element, for example, hydrogen (H), than other silicon oxides, an annealing process may be omitted after forming the filling insulating layer 61. The HDP oxide may have a profile conformal to morphology of a material located thereunder. Accordingly, when the filling insulating layer 61 includes the HDP oxide, the filling insulating layer 61 may have a convex shape, e.g., with an apex, on the uppermost metal interconnections 55. The filling insulating layer 61 may be formed to have a surface profile or pattern that has repeatedly alternating convex and concave portions, according to shapes of the uppermost metal interconnections 55.

Figure 3E:
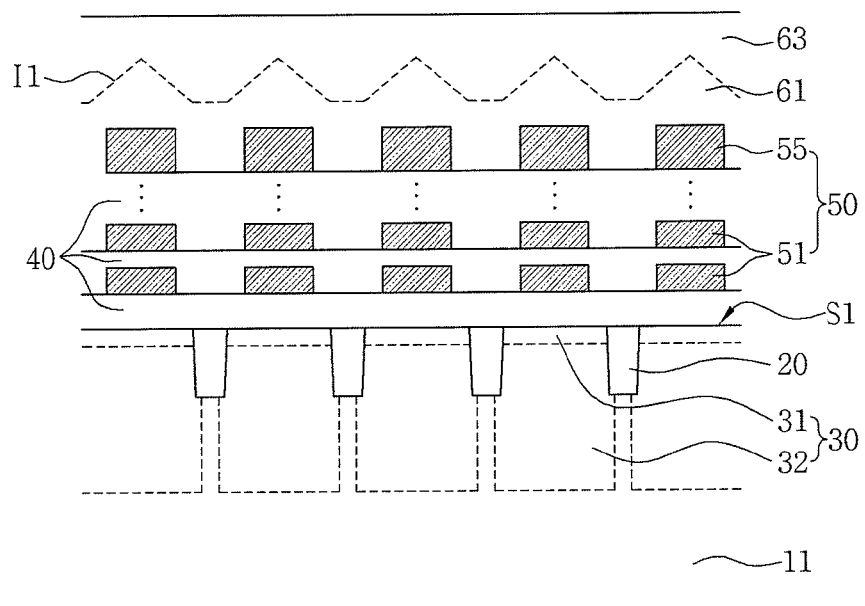

Referring to FIGS. 2A and 3E, the method may include forming a lower buffer insulating layer 63 on the filling insulating layer 61 (S160). The lower buffer insulating layer 63 may include a material which generates stress on the device substrate 11. For example, the lower buffer insulating layer 63 may generate a compressive stress on the device substrate 11. By generating the compressive stress on the device substrate 11, warpage or torsion of the device substrate 11 may be calibrated or released. The lower buffer insulating layer 63 may include a sparser insulating layer than the filling insulating layer 61. The lower buffer insulating layer 63 may be deposited to have an overall even or smooth surface profile using a PE-TEOS process. The PE-TEOS process may include a plasma deposition process using TEOS as a source. Accordingly, the lower buffer insulating layer 63 may include a PE-TEOS oxide formed from TEOS. A simple wet cleaning process may be performed after forming the lower buffer insulating layer 63. For example, the process may include cleaning a surface of the lower buffer insulating layer 63 using de-ionized water (DIW). Since the filling insulating layer 61 and the lower buffer insulating layer 63 include the same material, boundaries between the two may disappear. Accordingly, the boundaries between the filling insulating layer 61 and the lower buffer insulating layer 63 may be illustrated as a dotted line, as in FIG. 3E.

Figure 3F:
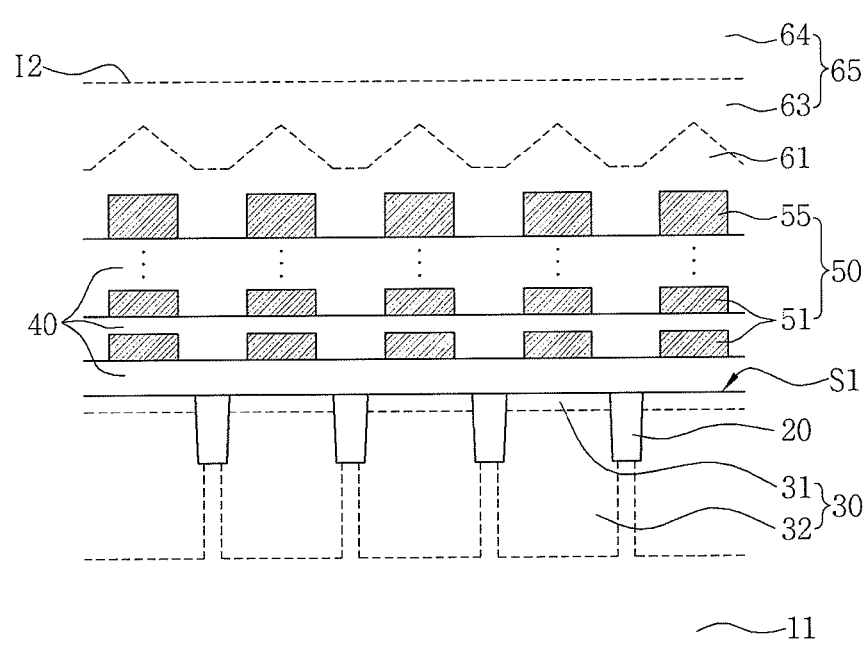

Referring to FIGS. 2A and 3F, the method may include forming an upper buffer insulating layer 64 on the lower buffer insulating layer 63 (S170). The upper buffer insulating layer 64 may include the same material as the lower buffer insulating layer 63. The upper buffer insulating layer 64 may be formed by the same process as the lower buffer insulating layer 63. For example, the upper buffer insulating layer 64 may also include the PE-TEOS silicon oxide formed by the PE-TEOS process. By forming the upper buffer insulating layer 64, the compressive stress may be applied on the device substrate 11 once more. Accordingly, the warpage or torsion of the device substrate 11 may be calibrated or released. Since the upper buffer insulating layer 64 and the lower buffer insulating layer 63 include the same material, boundaries between the upper buffer insulating layer 64 and the lower buffer insulating layer 63 may be imperceptible or nonexistent. The upper buffer insulating layer 64 and the lower buffer insulating layer 63 may combine to form a buffer insulating layer 65. The upper buffer insulating layer 64 may be formed to have a thickness that is the same or less than that of the lower buffer insulating layer 63.

Figure 3G:
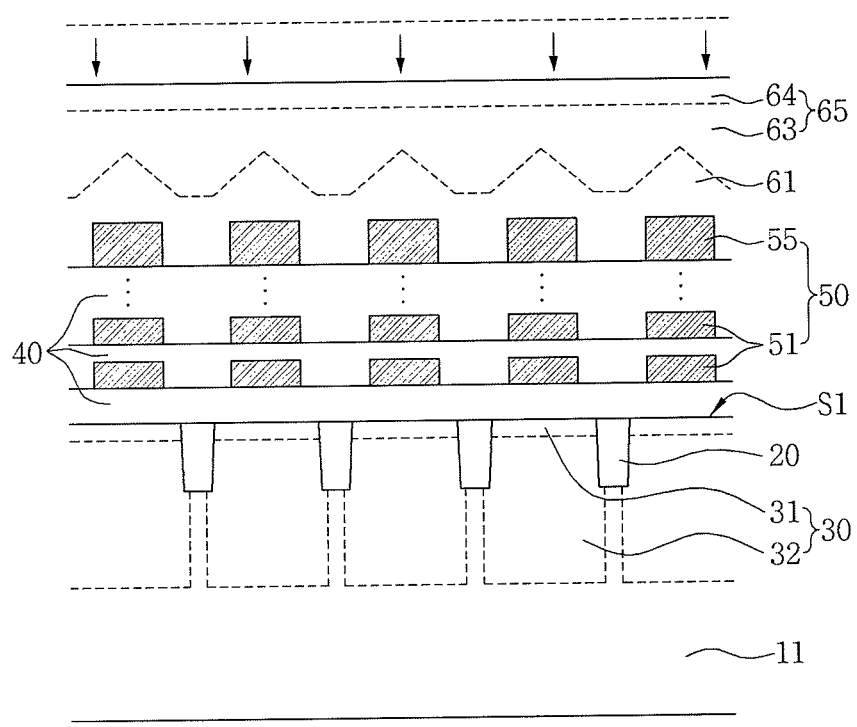

Referring to FIGS. 2A and 3G, the method may include performing a planarization process, such as a CMP or etchback, to recess an upper surface of the upper buffer insulating layer 64 by removing a portion of the upper surface of the upper buffer insulating layer 64 (S180). The upper buffer insulating layer 64 may remain thinner than the lower buffer insulating layer 63. During the planarization process, a process in which the surface of the upper buffer insulating layer 64 is wet cleaned using HF and/or water, may be performed in-situ. In-situ process may mean simultaneously or sequentially performing a process using the same equipment. After performing the planarization process, a process of annealing the upper buffer insulating layer 64 may be further performed.

Figure 3H:
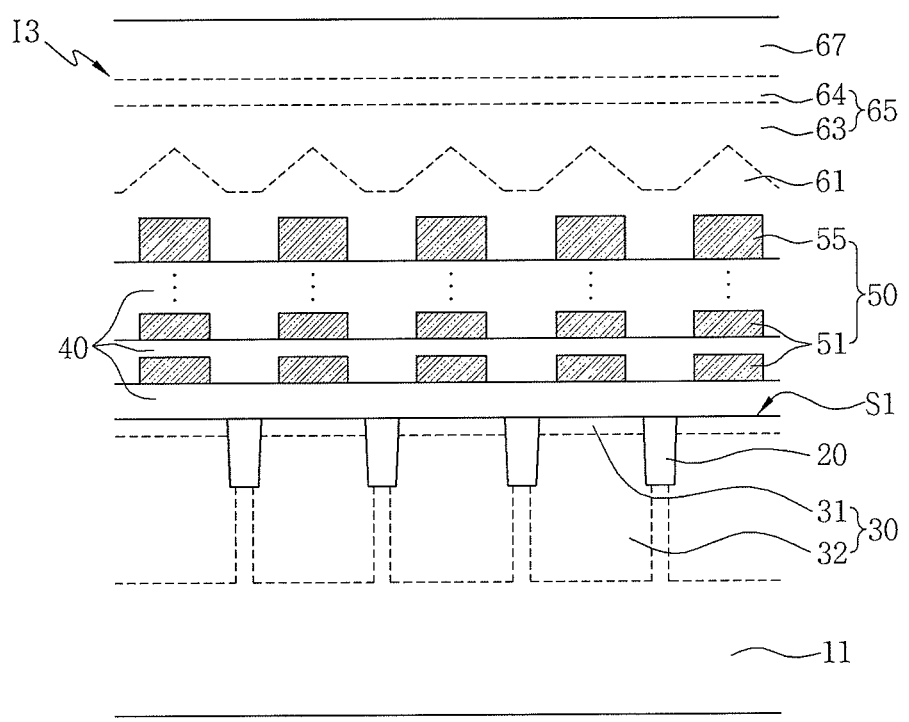

Referring to FIGS. 2A and 3H, the method may include forming a capping insulating layer 67 on the upper buffer insulating layer 64 (S190). The capping insulating layer 67 may include a denser insulating material than the upper buffer insulating layer 64. The capping insulating layer 67 may be formed by a HDP-CVD process, a PE-CVD process, an ALD process, a Sub-Atmosphere CVD process, or a PVD process. For example, in this embodiment, it is assumed and described that the capping insulating layer 67 is formed by the HDP-CVD process. Accordingly, the capping insulating layer 67 may include HDP oxide. When the capping insulating layer 67 and the upper buffer insulating layer 64 have the same material, such as silicon oxide, boundaries between the two may be imperceptible or nonexistent. Accordingly, the boundaries between the capping insulating layer 67 and the upper buffer insulating layer 64 are illustrated as a dotted line in the drawings.

The HDP process in accordance with an embodiment of the inventive concept may include supplying silane (SiH4) gas and O2 gas as source gases at a volume ratio of greater than 2 to 1. For example, the SiH4 gas and O2 gas may be supplied into a vacuum chamber 110 at a volume ratio of approximately 2.1:1 to 3:1. The HDP process in accordance with an embodiment of the inventive concept may include applying a source power of 3.0 KW to 4.8 KW and maintaining a temperature inside the vacuum chamber 110 in a range of about 300° C. to about 700° C. and more specifically, higher than 400° C., in order to enhance reactivity of the source gas. The HDP process in accordance with an embodiment of the inventive concept may include vacuumizing the inside of the vacuum chamber 110. The HDP process in accordance with an embodiment of the inventive concept may include applying an RF bias in a range of 5~50 MHz.

Figure 3I:
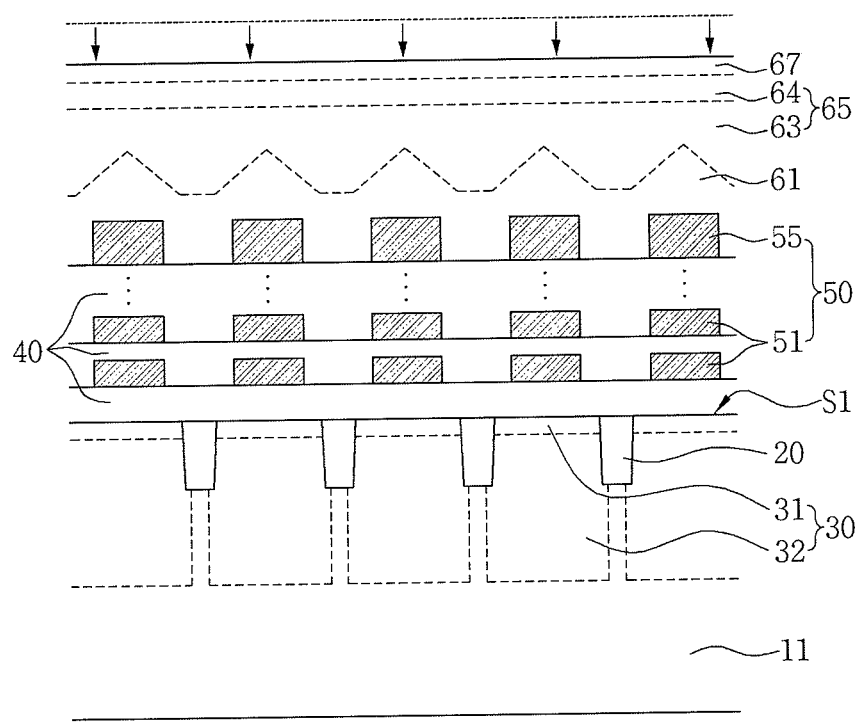
Figure 3J:

Referring to FIGS. 2A and 3I, the method may include performing a planarization process, such as a CMP or an etchback, to recess a surface of the capping insulating layer 67 by removing a portion of the surface of the capping insulating layer 67 (S200). During the planarization process, a process in which the surface of the capping insulating layer 67 is wet cleaned using HF and/or water, may be further performed in-situ. After performing the planarization process, a process of annealing the capping insulating layer 67 may be further performed.

Referring to FIGS. 2B (as a continuation of the method of FIG. 2A) and 3J, the method may include forming a mask pattern M on the supporting substrate 15 (S210). The supporting substrate 15 may include or be formed of a silicon wafer. Forming the mask pattern M may include forming a photoresist pattern using a photolithography process, as an example.

Figure 3K:
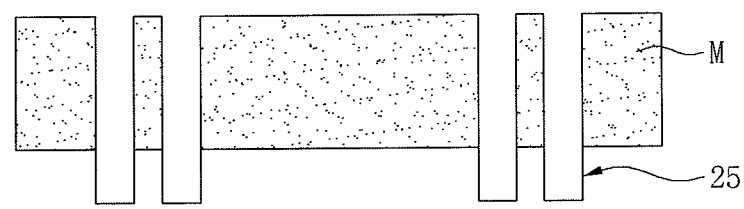

Referring to FIGS. 2B and 3K, the method may include forming alignment keys 25 in the supporting substrate 15 (S220). The forming the alignment keys 25 may include etching the supporting substrate 15 using the mask pattern M as an etch mask. Then, the mask pattern M may be removed. Accordingly, a silicon surface of the supporting substrate 15 may be exposed.

Figure 3L:
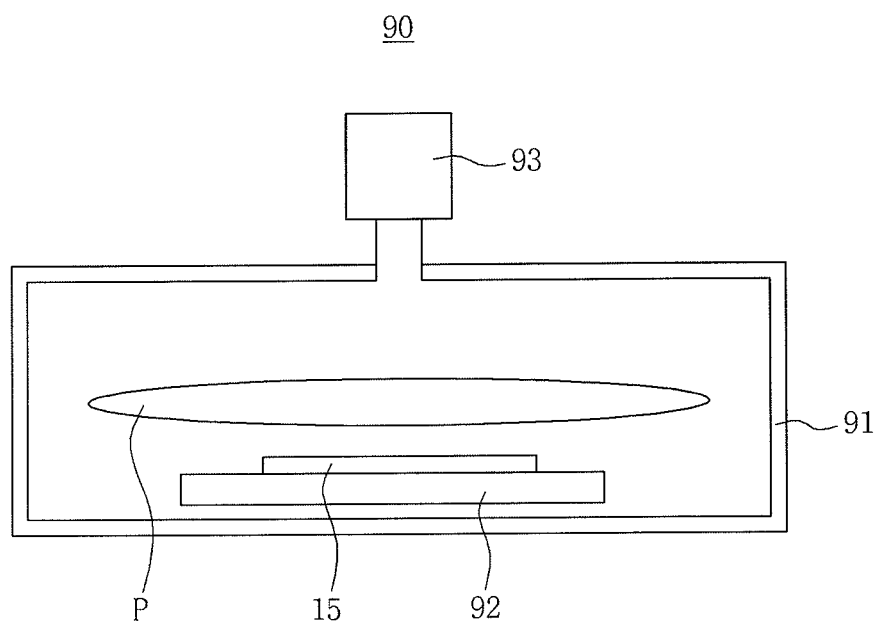

Referring to FIGS. 2B and 3L, the method may include performing a plasma treatment on the surface of the supporting substrate 15 (S230, S240). For example, the silicon surface of the supporting substrate 15 may be treated with $N_2$ plasma to be activated. The process may include loading the supporting substrate 15 on a chuck 92 in a reaction chamber 91 of plasma equipment 90, injecting plasma source through a source supplying part 93 to generate an excitation plasma P, and treating the surface of the supporting substrate 15 on the chuck 92.

Figure 3M:
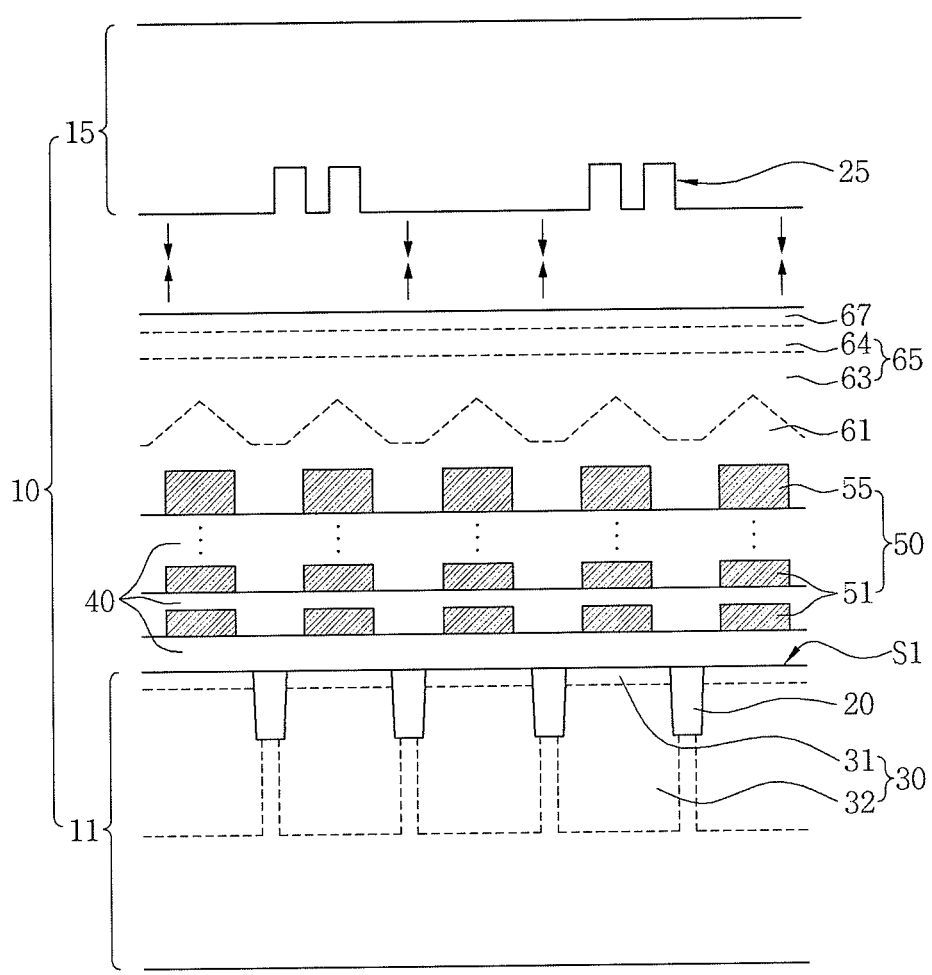

Referring to FIGS. 2B and 3M, the method may include bonding together the device substrate 11 and the supporting substrate 15 (S250). The bonding process may include applying pressure on the silicon surface of the capping insulating layer 67 and the silicon surface of the supporting substrate 15 at room temperature and atmospheric pressure. During the process, a bonded substrate structure 10 may be formed, in which the device substrate 11 and the supporting substrate 15 are bonded together.

Figure 3N:
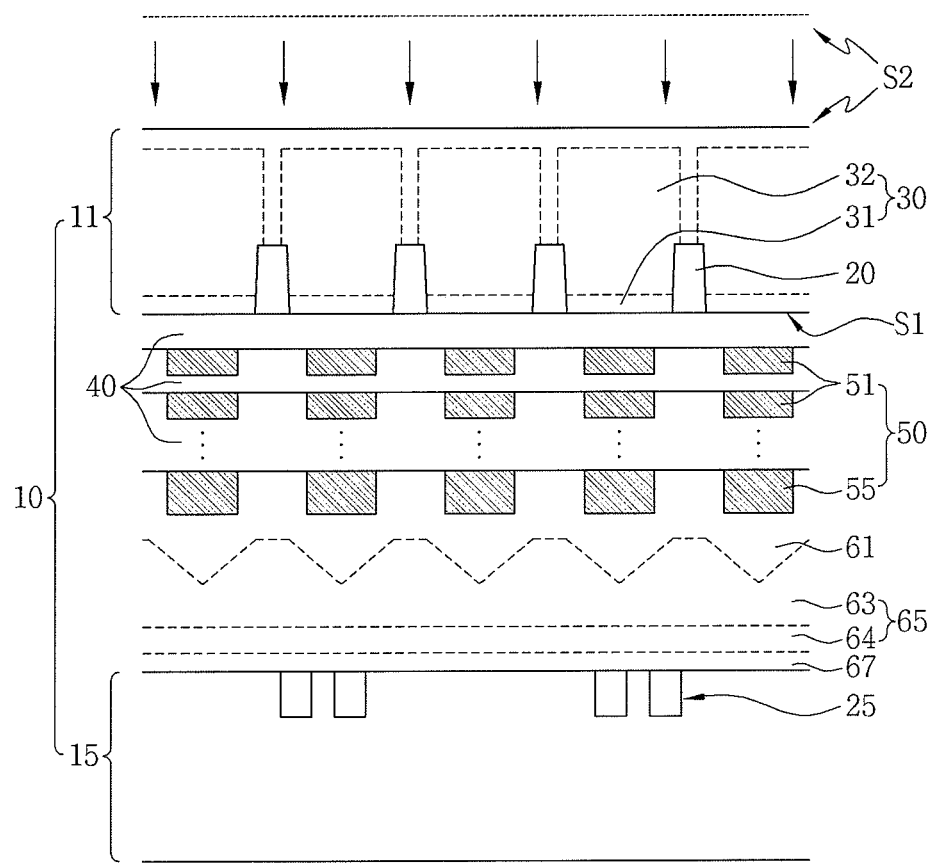
Figure 30:
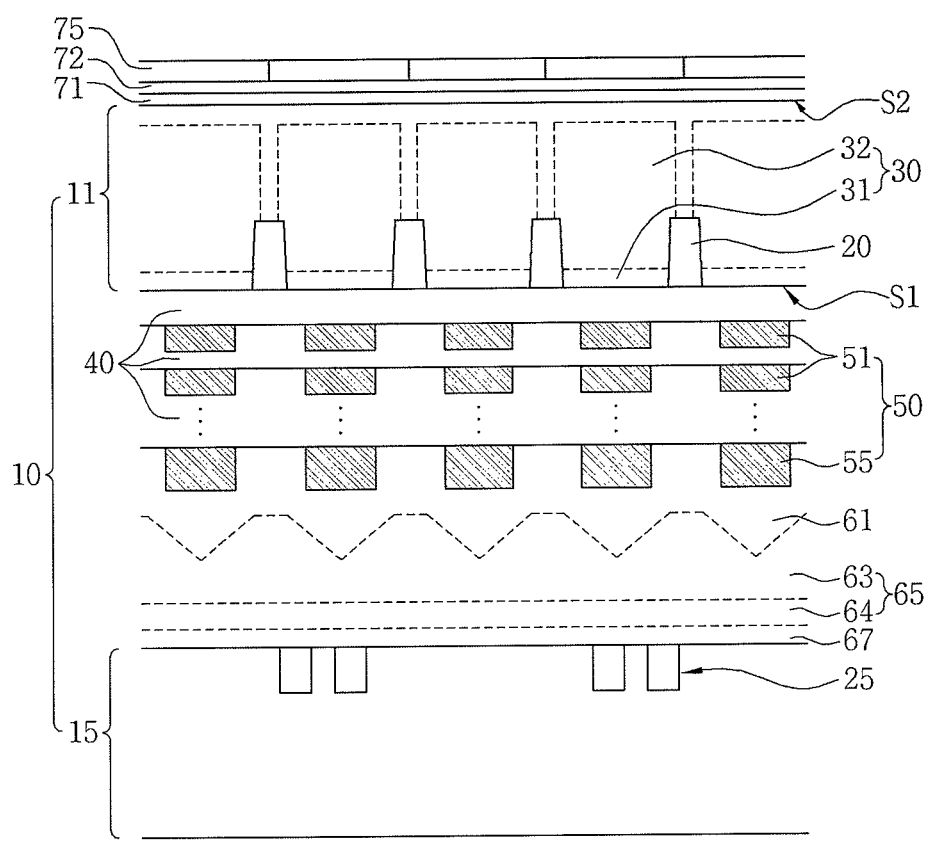

Referring to FIGS. 2B and 3N, the method may include turning over or inverting the bonded substrate structure 10 to recess the second surface S2 of device substrate 11 (S260). For example, the process may include performing grinding, a CMP, or an etchback to recess the second surface S2 of the device substrate 11, which thins the device substrate 11.

Referring to FIGS. 2B and 3O, the method may include forming a lower backside insulating layer 71, an upper backside insulating layer 72, and color filters 75 on the second surface S2 of the device substrate 11 (S270, S280, and S290), respectively. Forming the lower backside insulating layer 71 may include conformally forming silicon nitride or silicon oxynitride using a CVD process. Forming the upper backside insulating layer 72 may include conformally forming silicon oxide using a CVD process. Forming the color filters 75 may include coating or depositing a material, which selectively transmits a wavelength of light. The color filters 75 may include a red-green-blue (RGB) combination or a cyan-magenta-yellow (CMY) combination, as examples.

Then, referring to FIGS. 2B and 3P, the method may include forming microlenses 77 on the color filters 75 (S300).

Forming the microlenses 77 may include dropping and reflowing a high molecular weight organic material.

Figure 4A:
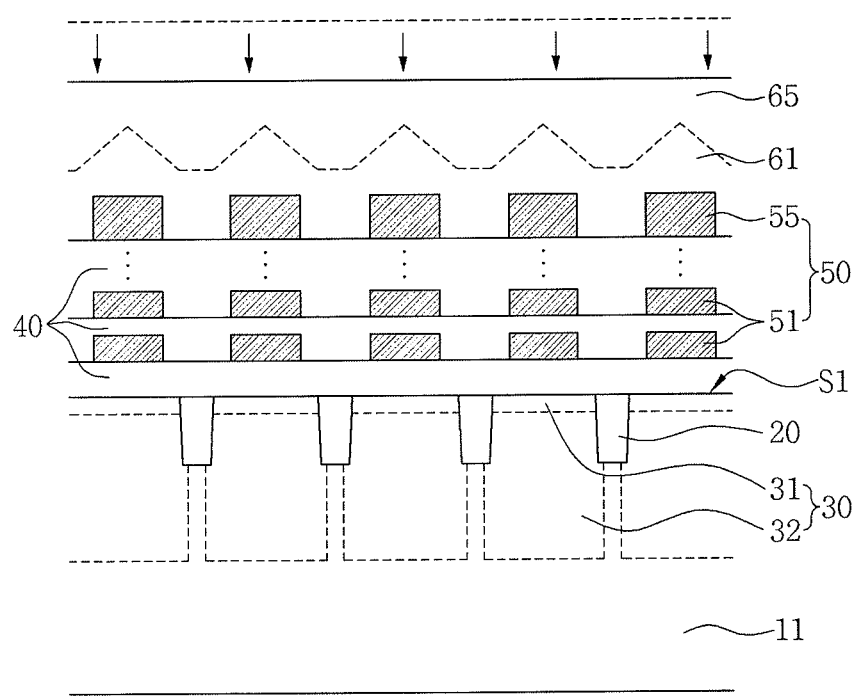
FIGS. 4A and 4B are cross-sectional views describing another embodiment of a method of forming a semiconductor device having a backside illuminated image sensor, in accordance with aspects of the inventive concept.
Figure 4B:
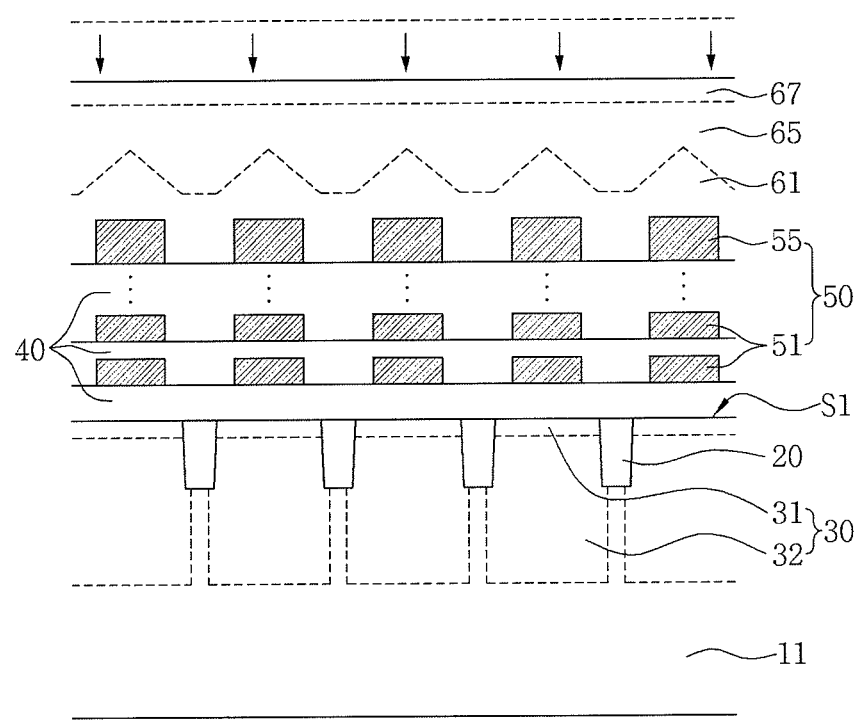

FIGS. 4A and 4B are cross-sectional views describing an embodiment of a method of forming a semiconductor device in accordance with aspects of the inventive concept.

Referring to FIG. 4A, the method of forming the semiconductor device in accordance with an embodiment of the inventive concept may include, after performing the processes described with reference to FIGS. 3A to 3D, forming a single-layered buffer insulating layer 65 on the filling insulating layer 61, and planarizing and removing an upper portion of the buffer insulating layer 65. Forming the buffer insulating layer 65 may include use of a PE-TEOS process with TEOS as a source. Removing the upper portion of the buffer insulating layer 65 may include performing a planarization process, such as a CMP or an etchback. The annealing process of the buffer insulating layer 65 may be further included after planarization of the buffer insulating layer 65. During the planarization of the buffer insulating layer 65, a process may be further performed in-situ in which the surface of the buffer insulating layer 65 is wet cleaned using HF and/or water.

Referring to FIG. 4B, the method may include forming a capping insulating layer 67 on the buffer insulating layer 65, and planarizing the capping insulating layer 67. The process may be understood with further reference to FIG. 3H and the processes described therein. Then, the process may include performing the processes described with reference to FIGS. 3I to 3O, followed by forming microlenses 77 to form the semiconductor device 1B illustrated in FIG. 1B.

Figure 5A:
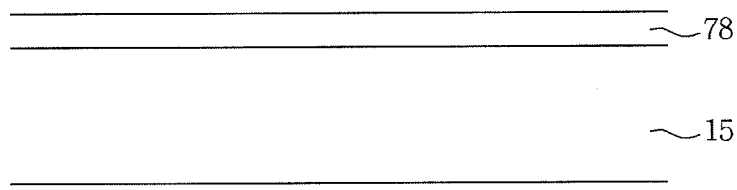
FIGS. 5A and 5B are cross-sectional views describing another embodiment of a method of forming a semiconductor device having a backside illuminated image sensor, in accordance with aspects of the inventive concept.
Figure 5B:
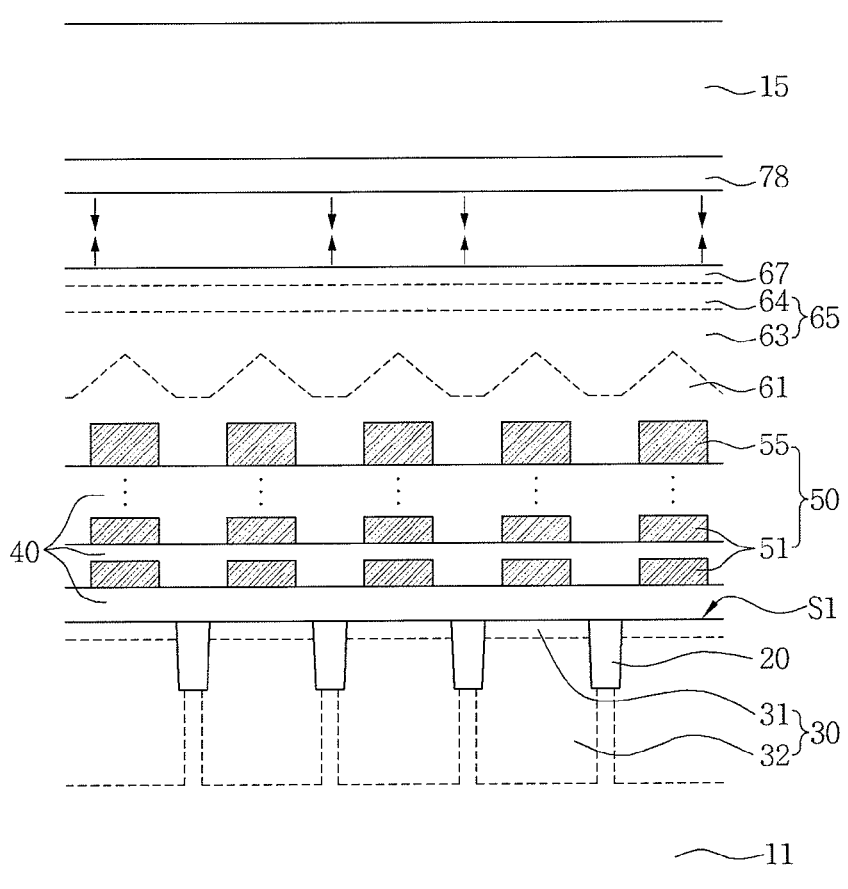

FIGS. 5A and 5B are cross-sectional views describing an embodiment of a method of forming a semiconductor device in accordance with aspects of the inventive concept.

Referring to FIG. 5A, the method of forming the semiconductor device in accordance with an embodiment of the inventive concept may include forming a support insulating layer 78 on the supporting substrate 15. The support insulating layer 78 may include or be formed of the same material as the capping insulating layer 67. After forming the support insulating layer 78, a process of planarizing a surface of the support insulating layer 78, a process of wet-etching the surface of the support insulating layer 78 using HF, and/or a process of annealing the support insulating layer 78 may be further performed.

Referring to FIG. 5B, the method may include bonding the capping insulating layer 67 and the supporting substrate 15, which may be formed by performing the processes described with reference to FIGS. 3A to 3I. Before the bonding process, a plasma treatment process on the surface of the capping insulating layer 67 and the surface of the support insulating layer 78 of the supporting substrate 15 may be further included. Then, the method may include performing the processes described with reference to FIGS. 3N and 3O, forming microlenses 77, and forming the semiconductor device 1C illustrated in FIG. 1C.

Figure 6A:
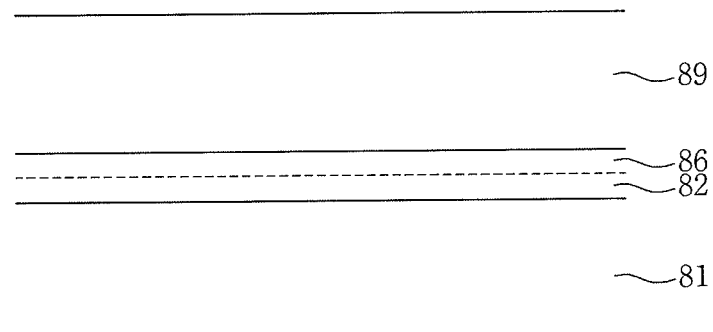
FIGS. 6A to 6C are cross-sectional views schematically illustrating embodiments of bonded substrate structures, in accordance with an embodiment of the inventive concept.
Figure 6B:
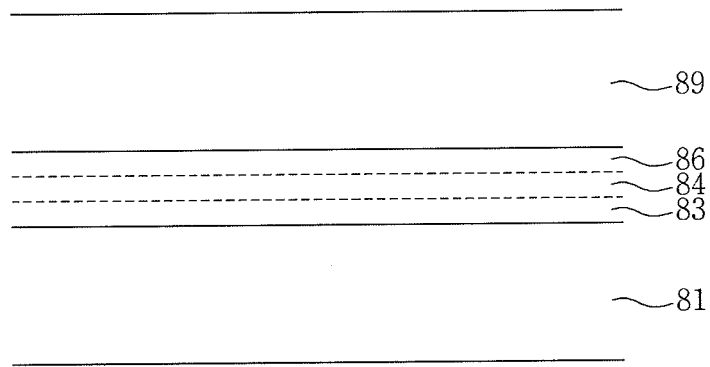
Figure 6C:
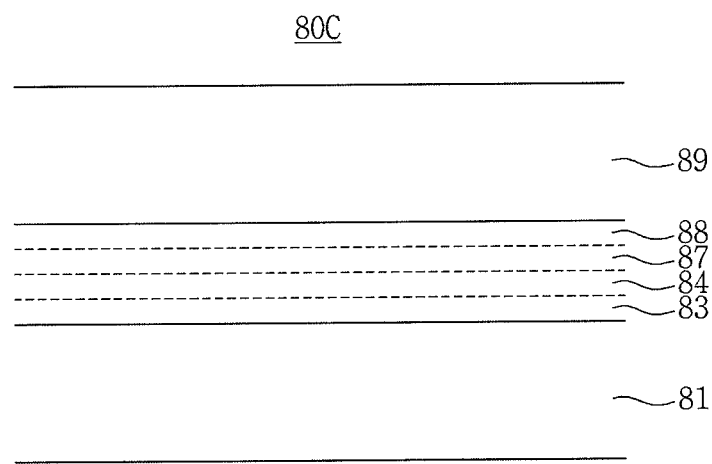

FIGS. 6A to 6C are cross-sectional views schematically illustrating embodiments of bonded substrate structures 80A, 80B, and 80C in accordance with aspects of the inventive concept.

Referring to FIG. 6A, the bonded substrate structure 80A in accordance with an embodiment of the inventive concept may include a lower substrate 81, a buffer oxide layer 82, a capping oxide layer 86, and an upper substrate 89. The lower and upper substrates 81 and 89 may include a silicon bulk wafer or a bare wafer, as examples. The buffer oxide layer 82 may include PE-TEOS oxide. The capping oxide layer 86 may include HDP oxide. The buffer oxide layer 82 may be as described with reference to the buffer insulating layer 65, and the capping oxide layer 86 may be as described with reference to the capping insulating layer 67.

Referring to FIG. 6B, the bonded substrate structure 80B in accordance with an embodiment of the inventive concept may include a lower substrate 81, a lower buffer oxide layer 83, an upper buffer oxide layer 84, a capping oxide layer 86, and an upper substrate 89. The lower buffer oxide layer 83 may as described with reference to the lower buffer insulating layer 63, and the upper buffer oxide layer 84 may be as described with reference to the upper buffer insulating layer 64.

Referring to FIG. 6C, the bonded substrate structure 80C in accordance with an embodiment of the inventive concept may include a lower substrate 81, a buffer oxide layer 82, a lower capping oxide layer 87, an upper capping oxide layer 86, and an upper substrate 89. The lower capping oxide layer 87 may be as described with reference to the capping insulating layer 67, and the upper capping oxide layer 88 may be as described with reference to the support insulating layer 78 of the specification.

Figure 7A:
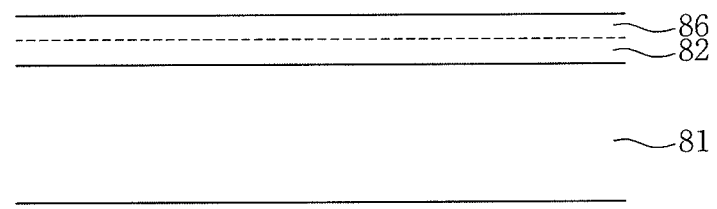
FIGS. 7A to 7C are cross-sectional views describing embodiments of methods of forming bonded substrate structures, in accordance with aspects of the inventive concept.
Figure 7B:
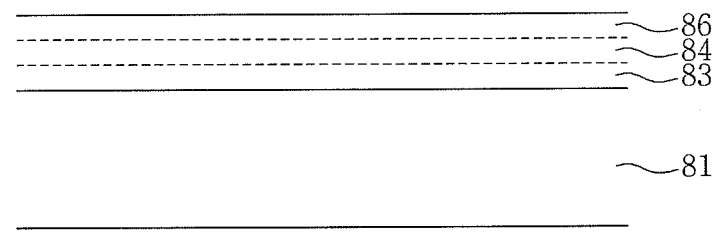
Figure 7C:
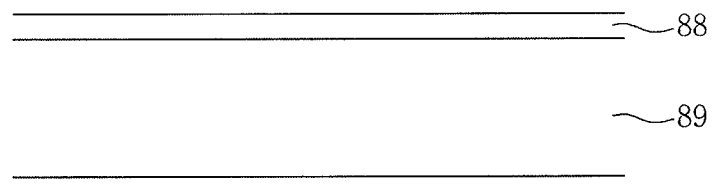

FIGS. 7A to 7C are cross-sectional views describing an embodiment of a method of forming the bonded substrate structures 80A to 80C in accordance with aspects of the inventive concept.

Referring to FIG. 7A, a method of forming the bonded substrate structures in accordance with an embodiment of the inventive concept may include preparing a lower substrate 81, forming a buffer oxide layer 82 on the lower substrate 81, and forming a capping oxide layer 86 on the buffer oxide layer 82. The buffer oxide layer 82 may include PE-TEOS oxide. Forming the buffer oxide layer 82 may be as described with further reference to FIGS. 3E to 3G, and/or 4A and the processes described therein. The capping oxide layer 86 may include HDP oxide, as an example. The forming the capping oxide layer 86 may be understood with further reference to FIGS. 3H, 3I, and 4A and the processes described therein. Then, with further reference to FIGS. 3J to 3O and the processes described therein, the bonded substrate structure 80A illustrated in FIG. 6A may be formed.

Referring to FIG. 7B, a method of forming the bonded substrate structure 80B in accordance with an embodiment of the inventive concept may include preparing a lower substrate 81 and forming a sequentially stacked lower buffer oxide layer 83, upper buffer oxide layer 84, and capping oxide layer 86 on the lower substrate 81. The lower and upper buffer oxide layers 83 and 84 may include PE-TEOS oxide, as an example. Forming the lower and upper buffer oxide layers 83 and 84 may be understood with further reference to FIGS. 3E to 3G and the processes described therein. Then, with further reference to FIGS. 3J to 3O and the processes described therein, the bonded substrate structure 80B illustrated in FIG. 6B may be formed.

Referring to FIG. 7C, a method of forming the bonded substrate structure 80C in accordance with an embodiment of the inventive concept may include preparing a lower substrate 81 by performing the processes described with reference to FIG. 7A or 7B, preparing an upper substrate 89, and forming an upper capping oxide layer 88 on the upper substrate 89. The upper capping oxide layer 88 may include HDP oxide, as an example. Forming the upper capping oxide layer 88 may be as described with reference to the process of forming the support insulating layer 78 in FIG. 5A. Then, upper surfaces of the lower and upper substrates 81 and 89 may be treated with plasma and bonded together.

Figure 8A:
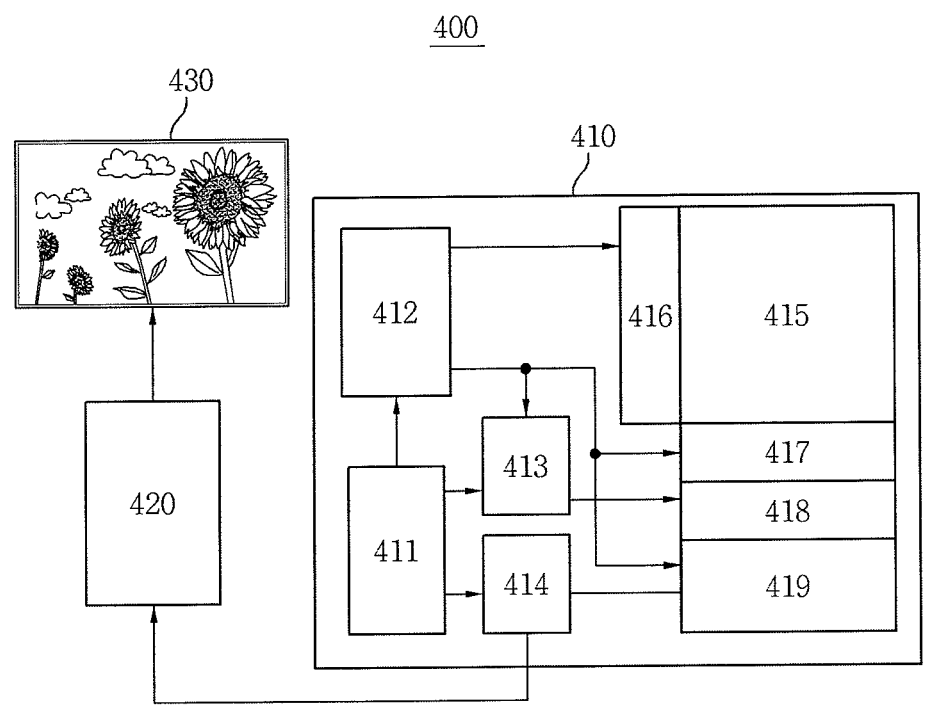
FIG. 8A is a block diagram schematically illustrating an embodiment of a camera system including a semiconductor device having a backside illuminated image sensor, in accordance with aspects of the inventive concept.

FIG. 8A is a block diagram schematically illustrating an embodiment of a camera system 400 in accordance with aspects of the inventive concept. Referring to FIG. 8A, the camera system 400 in accordance with an embodiment of the inventive concept may include an image sensing part 410, an image signal processing part 420, and an image display part 430. The image sensing part 410 may include a control register block 411, a timing generator 412, a lamp generator 413, a buffer part 414, an active pixel sensor array 415, a row driver 416, a correlated double sampler 417, a comparator 418, and an analog-digital converter 419. The control register block 411 may control an overall operation of the camera system 400. Specifically, the control register block 411 may directly transmit an operation signal to the timing generator 412, the lamp generator 413, and the buffer part 414. The timing generator 412 may generate a reference signal for determining operation timings of various components of the image sensing part 410. An operation timing reference signal generated from the timing generator 412 may be transmitted to the row driver 416, the correlated double sampler 417, the comparator 418, and/or the analog-digital converter 419, etc. The lamp generator 413 may generate and transmit a lamp signal used in the correlated double sampler 417 and/or the comparator 418. The buffer part 414 may include a latch circuit. The buffer part 414 may temporarily store an image signal to be transmitted to an external device. The active pixel sensor array 415 may sense an external image. The active pixel sensor array 415 may include a plurality of active pixel sensors, and each of the active pixel sensors may include the backside illuminated image sensor in accordance with the inventive concept. The row driver 416 may selectively activate a row of the active pixel sensor array 415. The correlated double sampler 417 may sample and output an analog signal generated from the active pixel sensor array 415. The comparator 418 may generate various reference signals by comparing a slope, etc. of the lamp signal given feedback according to data transmitted from the correlated double sampler 417 and analog reference voltages thereof. The analog-digital converter 419 may convert analog image data to digital image data.

The various parts shown and described in FIG. 8A may be all internal or part of a single device or they may variously be part of different devices, depending on the embodiment.

Figure 8B:
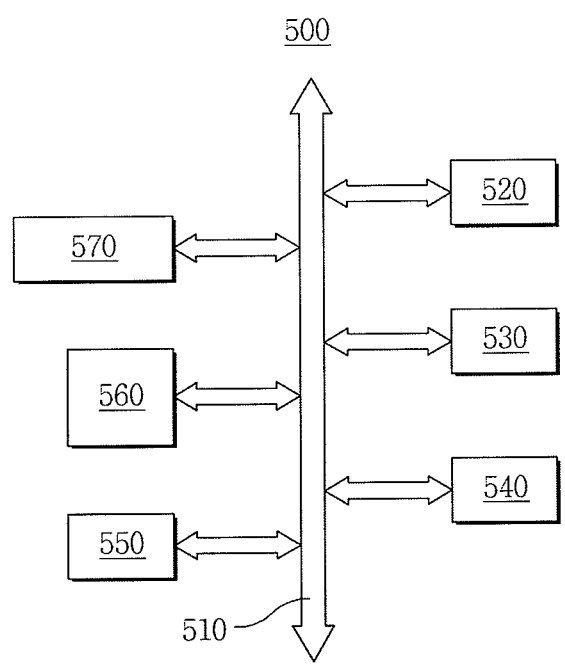
FIG. 8B is a block diagram schematically illustrating embodiment of an electronic system including a semiconductor device having a backside illuminated image sensor, in accordance with aspects of the inventive concept.

FIG. 8B is a block diagram schematically illustrating an embodiment of an electronic system 500 in accordance with an embodiment of the inventive concept. Referring to FIG. 8B, the electronic system 500 in accordance with the embodiment of the inventive concept may include a bus 510, an image sensing part 520 capable of input/output (I/O) communicating through the bus 510, a central processing apparatus 530, and an input/output (I/O) part 540. The electronic system 500 may further include a memory drive 550. The electronic system 500 may further include an optical disk drive (ODD) 560. The electronic system 500 may further include an external communication part 570.

The image sensing part 520 may include the backside illuminated image sensor in accordance with the inventive concept. The central processing apparatus 530 may include a microprocessor. The I/O part 540 may include one of various input devices including an operation button, a switch, a keyboard, a mouse, a keypad, a touch pad, a scanner, a camera, or a light sensor, etc. In addition, the I/O part 540 may include one of a LCD, LED and/or CRT monitor, a printer, and/or a display apparatus showing a variety of visual information. The memory drive 550 may include a dynamic random access memory (DRAM), a static random access memory (SRAM), a phase changeable random access memory (PRAM), a resistive random access memory (RRAM), a magnetic random access memory (MRAM), a non-volatile memory (NVM), a FLASH, a solid state disk (SSD), a hard disk (HD), and/or a variety of memory devices or a drive thereof. The optical disc drive 560 may include, for example, a CD-ROM drive, a DVD drive, etc. The external communication part 570 may include a modem, a LAN card, or a universal serial bus (USB), etc., and include an external memory, a wireless broadband (WiBro) communication apparatus, an ultraviolet communication apparatus, etc.

The various parts shown and described in FIG. 8B may be all internal or part of a single device or they may variously be part of different devices, depending on the embodiment.

Figure 8C:
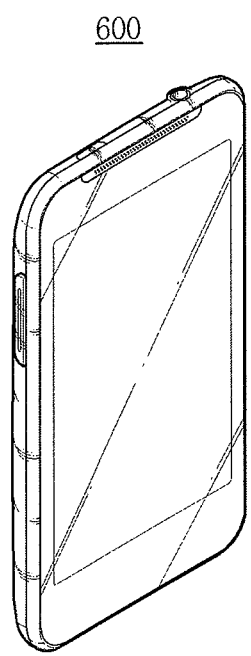
FIG. 8C is a diagram schematically illustrating a mobile apparatus including at least one of semiconductor device having a backside illuminated image sensor, in accordance with various aspects of the inventive concept.

FIG. 8C is a diagram schematically illustrating an embodiment of a mobile apparatus 600 including at least one of the semiconductor devices 1A, 1B, and 1C, in accordance with various aspects of the inventive concept. Referring to FIG. 8C, the mobile apparatus 600 may include a mobile phone, electronic book reader, or a tablet PC, as examples. In addition, at least one of the semiconductor devices 1A, 1B, and 1C in accordance with various embodiments of the inventive concept may be used in a portable computer, such as notebook, a MPEG-1 Audio Layer 3 (MP3) player, an MP4 player, a navigation apparatus, a solid state disk (SSD), a desktop computer, an automobile, or a home appliance, as well as the mobile phone or the tablet PC, as further examples.

Since the semiconductor devices in accordance with various embodiments of the inventive concept include a stably bonded substrate structure, physical stability of the device may be improved.

Since the semiconductor devices in accordance with various embodiments of the inventive concept include a capping insulating layer having a hydrophilic surface, bonding of substrates may be physically strengthened.

Since the semiconductor devices in accordance with various embodiments of the inventive concept are capped with an insulating layer having less out-gassing, surface toughness may be improved. Accordingly, bonded interfaces may widen overall without voids.

Since the semiconductor devices in accordance with various embodiments of the inventive concept include stably bonded substrates, physical stability of the bonded substrate structure may be improved.

Since semiconductor devices in accordance with various embodiments of the inventive concept include the insulating layer having less voids inside and an even or smooth surface, bonding of substrates may be physically strengthened.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of forming a semiconductor device having a backside illuminated image sensor, comprising:
    providing a first substrate and a second substrate;
    alternately forming multi-layered metal interconnections and multi-layered interlayer insulating layers on a first surface of the first substrate, wherein the metal interconnections have an uppermost metal interconnection on the interlayer insulating layers;
    forming a filling insulating layer filling spaces between sides of the uppermost metal interconnections on the interlayer insulating layers and covering upper surfaces of the uppermost metal interconnections;
    forming a buffer insulating layer softer than the filling insulating layer on the filling insulating layer;
    planarizing and wet-etching a surface of the buffer insulating layer;
    forming a capping insulating layer denser than the buffer insulating layer directly on the buffer insulating layer, wherein the filling insulating layer, the buffer insulating layer, and the capping insulating layer are formed of the same material;
    forming one or more alignment keys in the second substrate;
    bonding a surface of the capping insulating layer to a surface of the second substrate;
    forming color filters on a second surface of the first substrate; and
    forming microlenses on the color filters.

2. The method of claim 1, wherein the filling insulating layer comprises HDP oxide.

3. The method of claim 1, wherein the buffer insulating layer comprises PE-TEOS oxide.

4. The method of claim 1, wherein the buffer insulating layer comprises a lower buffer insulating layer and an upper buffer insulating layer, and the lower and upper buffer insulating layers include the same material.

5. The method of claim 4, further comprising:
    annealing the upper buffer insulating layer after planarizing the upper buffer insulating layer.

6. The method of claim 1, wherein the capping insulating layer comprises HDP oxide.

7. The method of claim 6, wherein the forming of the capping insulating layer comprises:
    loading the first substrate on a chuck in a vacuum chamber;
    supplying silane gas and oxygen gas at a volume ratio of greater than 2 to 1 into the vacuum chamber;
    applying a source power of greater than 3 KW into the vacuum chamber; and
    heating the chuck at a temperature of higher than 250 degrees Celsius.

8. The method of claim 6, further comprising:
    recessing the surface of the capping insulating layer using a planarization process.

9. The method of claim 8, further comprising:
    wet-etching the surface of the capping insulating layer using hydrofluoric acid when planarizing the capping insulating layer.

10. The method of claim 1, further comprising:
    applying a nitrogen plasma treatment to the surface of the second substrate before bonding the first substrate to the second substrate.

11. The method of claim 1, further comprising:
    forming field regions in the first substrate and a photodiode between the field regions before forming the metal wirings;
    recessing a second surface of the first substrate after bonding the capping insulating layer to the second substrate; and
    forming a second surface insulating layer on the recessed second surface,
    wherein the color filters are formed on the second surface insulating layer.

12. The method of claim 1, wherein the bonding the surface of the capping insulating layer to the surface of the second substrate comprises forming a HDP oxide layer on the surface of the second substrate, and bonding the surface of the capping insulating layer to a surface of the HDP oxide layer.

13. A method of forming a semiconductor device having a backside illuminated image sensor, comprising:
    providing a device substrate and a supporting substrate;
    forming photodiodes in the device substrate;
    alternately forming multi-layered interlayer insulating layers and metal interconnections having an uppermost metal interconnection on the interlayer insulating layer on a first surface of the device substrate;
    forming a lower HDP oxide layer covering the uppermost metal interconnection on the interlayer insulating layers;
    forming a lower PE-TEOS oxide layer on the lower HDP oxide layer;
    forming an upper PE-TEOS oxide layer on the lower PE-TEOS oxide layer;
    planarizing and wet-etching a surface of the upper PE-TEOS oxide layer;
    forming an upper HDP oxide layer directly on the surface of the planarized upper PE-TEOS oxide layer;
    forming one or more alignment keys in the support substrate;
    bonding a surface of the supporting substrate to the upper HDP oxide layer;
    forming color filters on a second surface of the device substrate; and
    forming microlenses on the color filters.

14. A method of forming a backside illuminated image sensor, comprising:
    providing a first substrate and second substrate;
    alternately forming multi-layered first TEOS layers and multi-layered metal interconnections, the metal interconnections having an uppermost metal interconnections on the first TEOS layers;
    forming a first HDP oxide layer covering the uppermost metal interconnections on the first TEOS layers, the first HDP oxide layer being denser than the first TEOS layers;
    forming a second TEOS layer on the first HDP oxide layer, the second TEOS layer being softer than the first HDP oxide layer;
    planarizing a surface of the second TEOS layer and sequentially wet-etching the surface of the second TEOS layer using an HF;
    forming a second HDP oxide layer directly on the second TEOS layer;
    forming an alignment key in the second substrate; and
    bonding a surface of the second HDP oxide layer to a surface of the second substrate.

15. The method of claim 14, further comprising:
    performing a first nitrogen plasma treatment on the surface of the second HDP oxide layer.

16. The method of claim 15, further comprising:
    forming a surface HDP oxide on the surface of the second substrate.

17. The method of claim 16, further comprising:
    performing a second nitrogen plasma treatment on a surface of the surface HDP oxide,
    wherein the bonding the surface of the second HDP oxide layer to the surface of the second substrate is bonding the surface of the second HDP oxide layer to the surface insulating layer of the surface of the second substrate.

18. The method of claim 14, wherein the second TEOS layer comprises a lower second TEOS layer and upper second TEOS layer on the lower second TEOS layer.

19. The method of claim 17, wherein the forming the alignment key in the second substrate comprises:
    forming a mask pattern on the surface of the second substrate;
    selectively etching the second substrate using the mask pattern as an etch mask; and
    removing the mask pattern.

20. The method of claim 14, further comprising:
    planarizing the surface of the second HDP oxide layer,
    wherein the surface of the second HDP oxide layer is not wet-etched using the HF.

* * * * *